Figure 1:
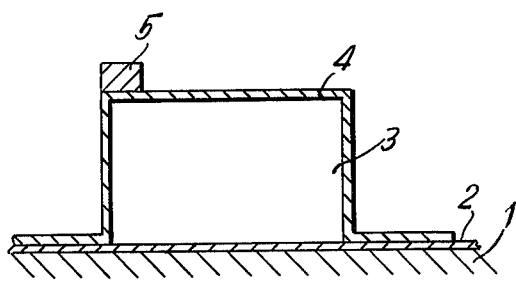

United States Patent [19]

Sakuma et al.

[11] 4,092,614
[45] May 30, 1978

[54] SEMICONDUCTOR LASER DEVICE EQUIPPED WITH A SILICON HEAT SINK

[75] Inventors: Isamu Sakuma; Hiroo Yonezu; Katsuhiko Nishida; Taibun Kamejima; Tonao Yuasa; Masayasu Ueno; Toshio Uji; Yasuo Nannichi; Izuo Hayashi, all of Tokyo, Japan

[73] Assignee: Nippon Electric Co., Ltd., Tokyo, Japan

[21] Appl. No.: 757,684

[22] Filed: Jan. 7, 1977

Related U.S. Application Data

[63] Continuation of Ser. No. 613,428, Sep. 15, 1975, abandoned.

[30] Foreign Application Priority Data

| Oct. 5, 1974 | Japan | 49-121124 |
| Oct. 5, 1974 | Japan | 49-121123 |
| Sep. 25, 1974 | Japan | 49-115560 |
| Sep. 21, 1974 | Japan | 49-114616 |

[51] Int. Cl.² .................................................. H01S 3/19
[52] U.S. Cl. .................. 331/94.5 P; 307/312; 331/94.5 H; 357/18; 357/19; 357/81
[58] Field of Search ............... 331/94.5 H, 94.5 P; 330/4.3; 357/16, 18, 17, 81, 19; 307/312

[56] References Cited

U.S. PATENT DOCUMENTS

| 3,303,432 | 2/1967 | Garfinkel et al. | 331/94.5 H |
| 3,458,703 | 7/1969 | Migitaka | 307/312 |
| 3,535,532 | 10/1970 | Merryman | 3457/19 X |
| 3,560,750 | 2/1971 | Nagata | 357/19 X |
| 3,566,215 | 2/1971 | Heywang | 357/94.5 H |
| 3,622,406 | 11/1971 | Nyal | 357/94.5 H |
| 3,628,048 | 12/1970 | Lee et al. | 307/312 X |
| 3,641,459 | 2/1972 | Paoli et al. | 357/19 X |

OTHER PUBLICATIONS

Patlach, "Laser Packaging" IBM Technical Disclosure Bulletin, vol. 13, No. 2, Jul. 1970, pp. 337–338.
Hutchins, IBM Technical Disclosure Bulletin, vol. 17, No. 1, Jun. 1974, p. 282.

Primary Examiner—Stanley D. Miller, Jr.
Assistant Examiner—James W. Davie
Attorney, Agent, or Firm—Hopgood, Calimafde, Kalil, Blaustein & Lieberman

[57] ABSTRACT

A semiconductor laser device in which at least one of the main surfaces of a semiconductor laser crystal body which generates heat during operation is brought into thermal contact with a silicon crystal heat-sink body.

8 Claims, 10 Drawing Figures ns in the
SEMICONDUCTOR LASER DEVICE EQUIPPED WITH A SILICON HEAT SINK This is a continuation of Ser. No. 613,428, filed Sept. 15, 1975 now abandoned.

The present invention relates to semiconductor laser devices equipped with an improved heat sink.

Prior art semiconductor laser techniques have realized continuous laser oscillation at room temperature with fairly high efficiency. In practical semiconductor laser devices, however, several problems must still be solved. First, the heat produced in the semiconductor junction due to a high current density of 5 to 8KA/cm$^2$ at laser oscillation must be vented through adequate thermal paths. Second, the laser operating current must be minimized by best confining the injection current to the oscillation region. One typical approach to the first problem has been to minimize the distance from the heat-generating junction to the heat sink and to maximize efficiency in heat dissipation by the use of a heat sink material of high thermal conductivity such as diamond. To cope with the second problem, various stripe-geometry semiconductor structures have been proposed. These efforts have made possible the realization of semiconductor lasers capable of continuous laser oscillation at room temperature over an extended period of time, thereby lengthening the life of semiconductor laser.

In this type of semiconductor laser, the thickness of the active layer which constitutes the laser resonator is in the order of wavelengths of a laser beam. Hence the laser beam generated is diffracted at the end of the active layer and diverged in the direction perpendicular to the plane of the active layer. As a result, if the semiconductor laser is mounted on the heat sink within its edges, the laser beam is intercepted by the heat sink, causing a large loss when the laser beam is coupled to an external optical system such as an optical fiber. No laser light interception must occur to enable the output laser beam to be effectively coupled to an external optical system. The prior art heat sink is typically of a diamond or copper block. To mount the semiconductor laser in position with its output end flush with an end of the copper block, the copper block must be sharply edged. In practice, however, the sharp edging of the copper block is extremely difficult to obtain by machining. The semiconductor laser must therefore be mounted within the edge of the heat sink, with the result that the output laser beam is readily intercepted before it leaves the laser device. While the diamond heat sink is free of these problems, it is very costly and requires intricate precision work to shape. Furthermore, because diamond is electrically an insulator, the diamond heat sink must be coated with a metal film before the semiconductor laser is mounted, as opposed to the copper heat sink on which it can be mounted directly.

To lengthen the life of the semiconductor laser, it is essential to minimize the strain which is exerted on the semiconductor laser when it is mounted on the heat sink in the following manner. (As for this technique, reference is made to a paper by R. L. Hartman et al published in Applied Physics Letters, Vol. 23, No. 3 (Aug. 1, 1973), PP. 147-149). The semiconductor laser is heated to a temperature above 200° C and fused to the heat sink with a metal solder and then cooled to ordinary temperatures. During the cooling, a strain is exerted on the semiconductor laser due to the difference in the thermal expansion coefficients. Ideally, therefore, there must be no difference in thermal expansion coefficient between the semiconductor laser and the heat sink. For example, the thermal expansion coefficient of GeAs semiconductor laser crystal is approximately 6.4 $\times$ 10$^{-6}$ deg$^{-1}$, while those of copper and diamond are 16.7 $\times$ 10$^{-6}$ deg$^{-1}$ and 1.1 $\times$ 10$^{-6}$ deg$^{-1}$ respectively. This difficulty should also be overcome.

It is therefore an object of the invention to provide a semiconductor laser device equipped with a heat sink which is free of the problems of the conventional copper and diamond heat sinks, and which enhances the efficiency of coupling the output laser beam to an external optical system, minimizes the strain exerted on the semiconductor laser, facilitates the making of electrical contact with the semiconductor laser, and reduces the cost of the laser device.

It is another object of the invention to provide a semiconductor laser device equipped with a heat sink which can easily be processed to a desired shape.

It is another object of the invention to provide a semiconductor laser device equipped with a heat sink capable of offering additional functions and expanding the range of laser applications.

With these and other objects in view, the invention provides a semiconductor laser device comprising a semiconductor laser crystal pellet equipped with a silicon crystal heat sink body. On the silicon crystal body which constitutes the heat sink, the desired circuit elements can be formed by selectively diffusing impurities to permit the laser device to have additional functions such as reverse current blocking and drive current stabilizing.

Figure 3:
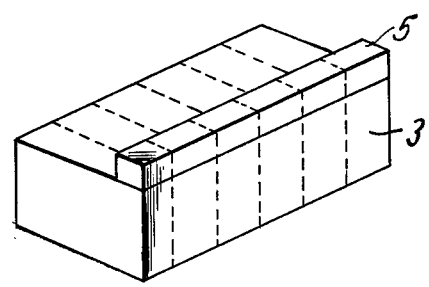
Figure 2:
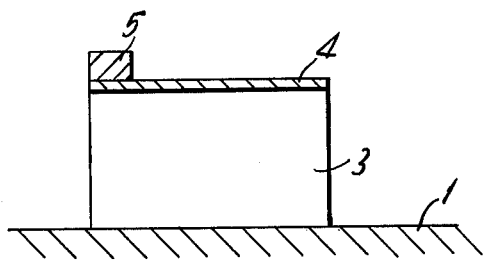
Figure 4:
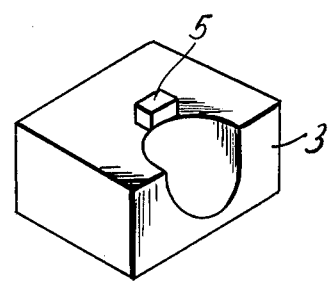
Figure 5:
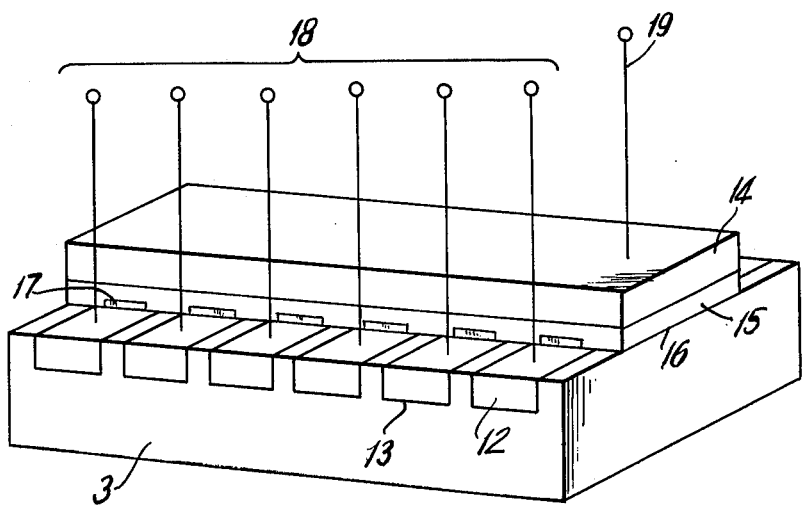
Figure 6:
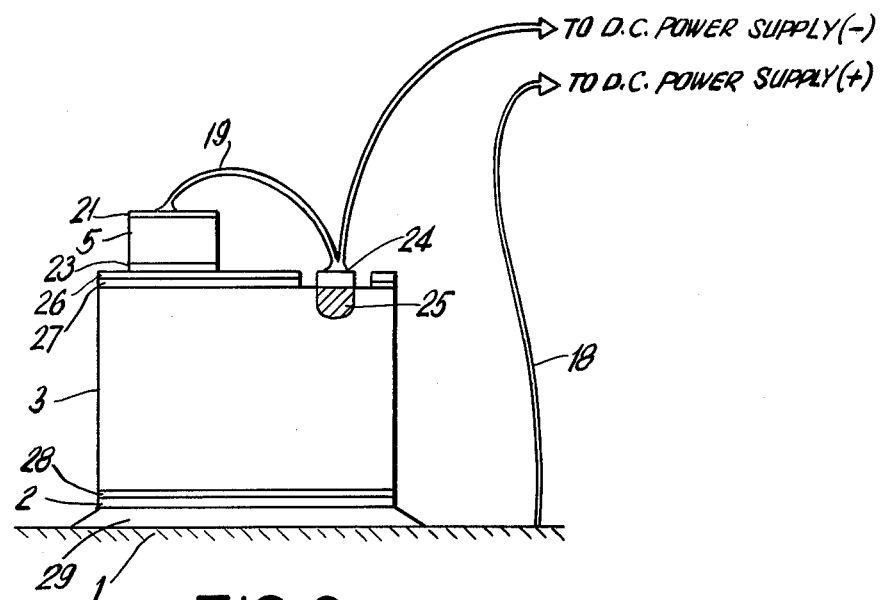
Figure 7:
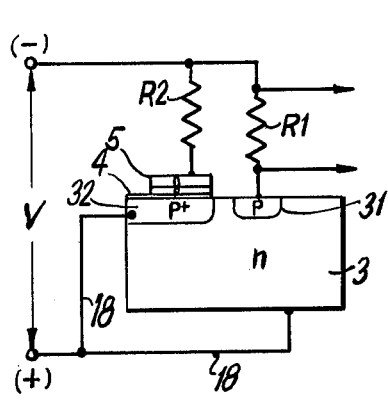
Figure 8:
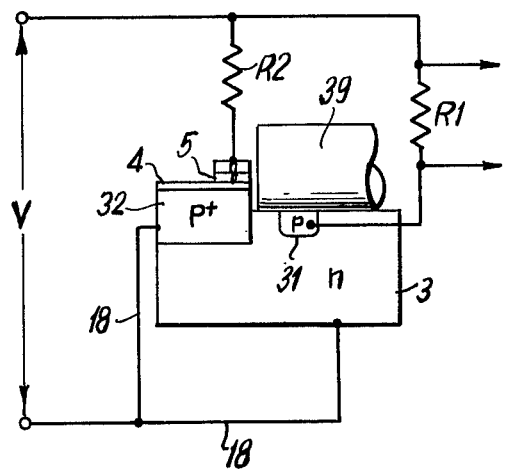
Figure 9:
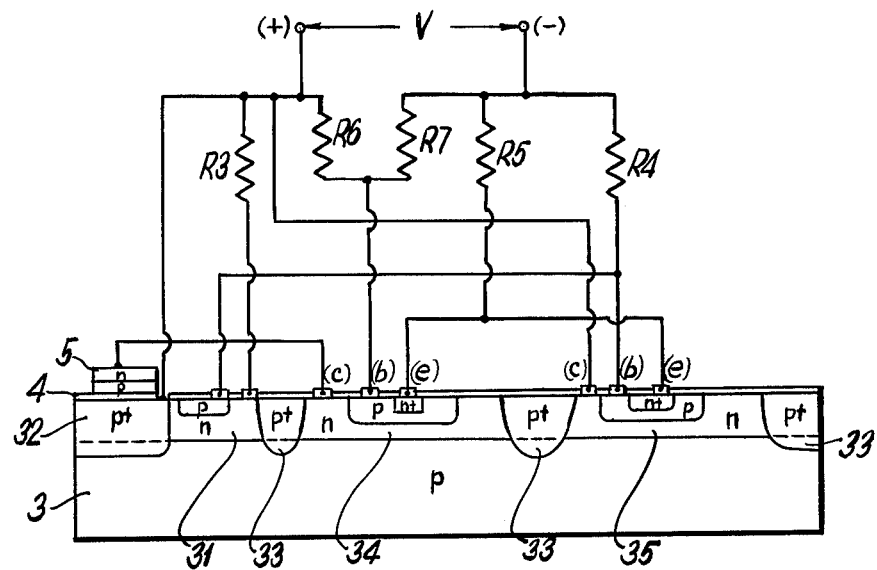
Figure 10:
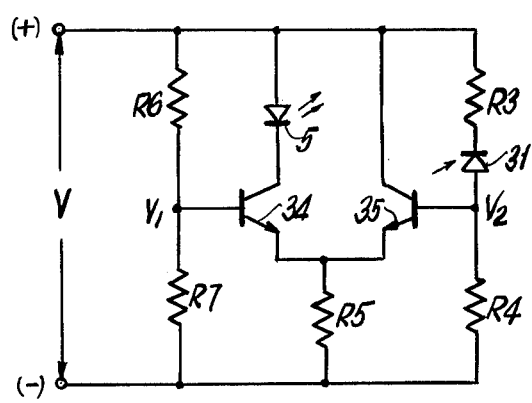

Further objects, features and advantages of the invention will appear in the following detailed description taken in conjunction with the accompanying drawings, wherein:

FIG. 1 is a side sectional view showing a semiconductor laser of a first embodiment of the invention, FIG. 2 is a side sectional view showing a semiconductor laser of a second embodiment of the invention, FIG. 3 is a perspective view showing a semiconductor laser of a third embodiment of the invention, FIG. 4 is a perspective view showing a semiconductor laser of a fourth embodiment of the invention, FIG. 5 is a perspective view showing a semiconductor laser array of a fifth embodiment of the invention, FIG. 6 is a side sectional view showing a semiconductor laser of a sixth embodiment of the invention, FIG. 7 is a circuit diagram showing the construction of a semiconductor laser of a seventh embodiment of the invention, FIG. 8 is a circuit diagram showing the construction of a semiconductor laser of an eighth embodiment of the invention, FIG. 9 is a circuit diagram showing the construction of a semiconductor laser of a ninth embodiment of the invention, and FIG. 10 is an equivalent circuit diagram of the ninth embodiment of the invention.

In the first embodiment of the invention as illustrated in FIG. 1, which comprises a semiconductor laser mounted on a silicon heat sink, a metal plate 1 is coated with a gold layer 2, onto which a silicon crystal body 3 provided by cleaving a silicon single crystal wafer is thermally bonded. A metal plate 4 is formed on the surface of the crystal body 3 by depositing titanium and tin, on which a semiconductor laser pellet 5 is fused with a metal solder. Unlike machining, the cleavage of the silicon crystal wafer permits the silicon crystal body 3 to be sharply edged. This facilitates the mounting of the semiconductor laser pellet 5 at an edge of the heat sink. Because silicon crystal can easily be etched, part of the silicon crystal body 3 on which the laser pellet 5 is mounted can readily be removed by etching. In other words, the front end of the heat sink can be etched to be flush with the mirror surface of the semiconductor laser pellet 5 and thus the output beam from the laser can be prevented from being intercepted by the silicon crystal body 3.

The thermal expansion coefficient of silicon crystal is $2.4 \times 10^{-6} \deg^{-1}$ which is much nearer that (approximately $8.7 \times 10^{-6} \deg^{-1}$) of the crystal of the semiconductor laser than those of copper and diamond ($16.7 \times 10^{-6} \deg^{-1}$ and $1.1 \times 10^{-6} \deg^{-1}$ respectively). As a result, the strain exerted on the semiconductor laser pellet during the mounting can be minimized and the life of the laser device can be lengthened.

Furthermore, because silicon crystal offers better electrical conductivity as the carrier concentration is increased, it becomes feasible to use the heat sink directly as an electrode and obviate the need for a lead. Further, an electric circuit can be formed in the heat sink structure.

The main reason why silicon has not be used as the material of the heat sink is probably the fact that the thermal conductivity of silicon is relatively small, i.e., approximately 1.5 W/cm/° C compared with that of diamond of type IIa (approximately 22 W/cm/° C) and that of copper (approximately 4 W/cm/° C). The thermal conductivity of silicon is still large enough when compared with that of GaAs (approximately 0.5 W/cm/° C) and that of $Al_{0.3}Ga_{0.7}As$ (approximately 0.1 W/cm/° C) which are materials of the semiconductor laser. Hence it can safely be said that silicon is practicable for the material of heat sink.

In experiments the inventors of this invention have found that continuous oscillation is available with a semiconductor laser mounted on a silicon crystal heat sink, the light output being still as large as 70 to 80% of that available with one mounted on a diamond (type IIa) heat sink. This laser efficiency is good enough for practical applications. The use of silicon crystal for the heat sink leads to great usefulness for lasers of any output level except for the extremely high-level ones under continuous oscillation and for pulsed lasers.

The silicon crystal body 3 may be prepared from a silicon single crystal wafer by multi-wire sawing, chemical etching, ion-etching, sand-blasting, or other known techniques or by a combination of these techniques.

In the second embodiment of the invention as illustrated in FIG. 2 a copper layer 4 as thick as the width of the semiconductor laser stripe is formed on a silicon crystal body 3 by plating or other suitable techniques, on which a semiconductor laser crystal pellet 5 is mounted. In this structure, the thermal expansion depends nearly solely upon silicon, and the thermal resistivity depends nearly solely upon copper, whereby a sufficiently high heat dissipating efficiency is obtained. This laser device can provide approximately the same light output under continuous oscillation as is available with one mounted on a copper heat sink, and can operate for a considerably longer life than one mounted on a copper heat sink.

In the third embodiment of the invention therefore a plurality of semiconductor laser pellets 5 disposed in a row on the individual silicon crystal bodies 3. This laser device may be used as a laser array or divided into laser units along the dotted lines shown in FIG. 3 for use as individual semiconductor lasers. This laser array construction can easily be formed by the use of silicon crystal body 3, thus enhancing productivity and improving mechanical accuracy in mounting the laser pellet on the silicon crystal heat sink.

In the fourth embodiment of the invention as illustrated in FIG. 4, a semiconductor laser crystal pellet 5 is mounted at the edge of a groove selectively formed on a silicon crystal body 3 by taking advantage of the fact that silicon crystal can easily be worked. This groove is useful especially when a lens system is installed for converging a spreading output laser beam into a parallel beam or when an optical fiber is installed for light transmission.

FIG. 5 illustrates a fifth embodiment of the invention wherein semiconductor laser pellets are disposed in an array on a silicon heat sink. This intricate array construction cannot be realized with a diamond or copper heat sink. Boron is diffused into an n-type silicon crystal body 3 by selective diffusion techniques using a $SiO_2$ film as in the fabrication of silicon devices, whereby a plurality of stripe-geometry p-type regions 12 are formed in the same plane and thus p-n junctions 13 are formed in the silicon crystal heat sink. A p-type layer 15 is formed on an n-type GaAs crystal 14 by liquid-phase epitaxial techniques whereby a p-n junction 16 is formed. A plurality of mutually independent p-side electrodes 17 are formed in stripe-geometry by depositing metal films on the p-type layer 15. In this construction, the electrodes 17 are electrically isolated from each other by the $SiO_2$ film whereby a semiconductor laser crystal comprising a plurality of semiconductor lasers is obtained. (The method of making the constituent elements 14, 15, 16 and 17 of this semiconductor laser device is described in detail in copending Application Ser. No. 492,262 filed by the present applicants, now U.S. Pat. No. 3,920,491. The p-side electrodes 17 are disposed at regular intervals equal to those of the p-n junctions 13 disposed on the n-type silicon crystal. The electrode 17 must be smaller than the p-type region 12 with respect to width and length. This semiconductor laser array is mounted on the silicon crystal body 3 so that the p-side electrodes 17 exactly meet the respective stripe-geometry p-type regions 12. P-type leads 18 are formed on the individual p-type regions 12, and an n-type lead 19 is formed on the n-type GaAs crystal 14. In this embodiment, the n-type elements may be reversed to p-type and vice versa. For electrical connection between the semiconductor laser crystal and the silicon crystal body (i.e., the heat sink), a soft metal such as indium may be used as the material of the p-side electrodes 17 which are fused directly to the p-type regions 12 of the silicon crystal body to establish ohmic contact therebetween. This is possible because the p-type region of the silicon crystal body has a large electrical conductivity. As described, the p-type regions 12 are electrically isolated from each other by the p-n junctions 13 and are wider than the p-type electrodes 17 and disposed at the same intervals as the p-type electrodes 17. This signifies the fact that the p-side semiconductor laser electrode which comprises the p-type electrode 17, p-type region 12 and p-type lead 18 is provided for each of the semiconductor lasers in an array.

This construction formed of semiconductor lasers in an array on a silicon heat sink can readily be realized by the known semiconductor fabrication techniques. Furthermore, the integration of this construction is several times greater than that obtainable with the construction in which a diamond heat sink is used. Further, this embodiment permits the fabrication of a semiconductor laser array with a far wider area than is obtainable with a construction using a diamond heat sink. Still further, the semiconductor laser device of this embodiment is far less expensive than those incorporating a diamond heat sink. Still further, because leads are not necessarily led out directly from the semiconductor laser but instead can be formed on the silicon crystal body, the assembly of the semiconductor laser device is much simplified.

FIGS. 6 to 9 illustrate sixth to ninth embodiments of the invention which make additional functions available by the use of a silicon heat sink. A semiconductor laser is very likely to be damaged by a small amount of reverse current and hence a bias circuit is indispensible to prevent such surge current from flowing into the semiconductor laser. Although this bias circuit has heretofore been provided at the external power source which drives the semiconductor laser device, it is desirable that the bias circuit be installed in the semiconductor laser device itself in view of operating ease and device reliability. In the embodiment is illustrated in FIG. 6 a surge current blocking rectifier is installed on a silicon heat sink. This semiconductor laser device consists essentially of a $GaAs$-$Ga_{1-x}Al_xAs$ double-heterostructure laser 5 and a silicon heat sink 3. The heat sink 3 is of n-type silicon single crystal with two surfaces polished, approximately 1.5 mm thick, 2 mm width and 2 mm long. On the top surface of the silicon single crystal, a p-type layer 25 of 500 $\mu$m in diameter is formed by diffusing boron by the known selective diffusion techniques, and an aluminum layer 24 is formed to a thickness of 3 $\mu$m as an ohmic electrode for the p-type layer 25. Electrically independent of the aluminum electrode 24, a 0.3 $\mu$m thick chromium layer 27 for ohmic contact with the n-type silicon heat sink 3, and a tin layer 26 for fusing the semiconductor laser to the heat sink are formed. to this tin layer, a 1 $\mu$m thick p-type gold electrode 23 lying closer to the active layer of the $GaAs$-$Ga_{1-x}Al_xAs$ double-heterostructure semiconductor laser 5 is fused at a temperature of about 240° C (i.e., near the melting point of tin).

On the bottom of silicon heat sink 3, a 0.3 $\mu$m thick ohmic chromium layer 28 and a 3 $\mu$m thick gold layer 2 are formed. Then, through a Pb.Sn solder layer 29, the silicon heat sink 3 is fused to a copper case 1 capable of efficient heat dissipation. Aluminum leads 19 from the n-type electrode 21 of the semiconductor laser 5 and from the aluminum electrode 24 of the rectifier are connected to the negative side of a DC power supply. Another aluminum lead 18 from the metal case 1 is connected to the positive side of the DC power supply.

In this construction, any backward surge current flows only through the silicon crystal body 3 and the p-type layer 25 which constitute a rectifier, and hence the semiconductor laser 5 is protected. The reverse peak voltage of the rectifier can be increased by suitably determining its carrier concentration.

If the electric resistance of silicon brings about effects upon the silicon crystal heat sink such as heat produced during operation, the lead 18 to the positive side of the DC power supply may be led directly from the tin layer 26.

A semiconductor laser with a p-type electrode formed near the active layer has been described above. This embodiment is similarly applicable to a semiconductor laser using a p-type substrate wherein the n-type electrode is near the active layer. In this construction, a p-type substrate is used for the silicon crystal heat sink, and an n-type region is formed of phosphorus or the like.

This embodiment utilizes a p-n junction for the rectifier installed on the silicon single crystal heat sink. For this purpose, a Schottky barrier may be used instead of a p-n junction.

In the seventh to ninth embodiments of the invention, a photodiode for detecting a laser beam is incorporated into the silicon crystal heat sink to make additional functions available. Generally, a semiconductor laser is susceptible to changes in ambient temperatures and, as a result, the laser output tends to decrease with a rise in temperature. Hence it is often necessary to monitor the laser output by a photodetector. When a laser output of constant intensity is desired from a semiconductor laser, a control circuit comprising a photodetector is used as near as is feasible to the semiconductor laser to stabilize the laser output.

In the embodiment of the invention schematically illustrated in FIG. 7, a photodiode for monitoring the laser output is incorporated into the silicon crystal heat sink. Boron is diffused into an n-type silicon crystal body 3 by selective diffusion techniques to form a photodiode 31 having a p-n junction. A $p^+$ isolation region 32 is formed in part of the silicon crystal body 3 by boron diffusion. A metal film 4 is formed on the region 32 by depositing titanium and tin. A semiconductor laser crystal pellet 5 is installed on the metal film 4 so that the p-type layer near the active layer of the laser pellet is bonded to the metal film 4 by thermal fusing. An electrode lead is connected to the n-type region of the laser pellet, and a resistor $R_2$ is connected to the lead. An electrode lead 18 is connected to one end of the $p^+$ region 32 and to the n-type region of the photodiode. The p-type region of the photodiode 31 is connected to a resistor $R_1$ by way of a lead wire. A DC voltage V is applied between the resistor $R_2$ and the $p^+$ region of the semiconductor laser and between the resistor $R_1$ and the n-type region of the photodiode. As a result, the semiconductor laser is biased forward, and the photodiode is reverse biased. By suitably determining the resistance value of resistor $R_2$, a laser beam of the desired output can be derived from the semiconductor laser. The diverging angle of the laser beam from the mirror surface of the semiconductor laser crystal is as large as $\pm 40°$ in the direction perpendicular to the p-n junction plane. Therefore, part of this laser beam reaches the surface of the silicon crystal where the photodiode 31 is formed. Since the refraction index of silicon is as large as 3.5, the part of the laser beam is not totally reflected but is refracted and enters the silicon crystal. The intensity of the laser light per unit area is large as the laser beam is nearer the semiconductor laser. Thus, if the photodiode is formed reasonably near the semiconductor laser, part of the laser beam efficiently falls on the photodiode to cause a sufficiently large light current to flow through the photodiode.

In this example, a $GaAs$-$Al_xGa_{1-x}As$ heterojunction laser is installed on the silicon crystal heat sink. Laser oscillation occurs when volts V = 5 V and $R_2$ = 29$\Omega$. When $R_1$ = 100$\Omega$, the photodiode 31 is reversely biased at about 5 volts, and an output voltage of 1 MV is produced across the resistor $R_1$. When the voltage applied to the semiconductor laser 5 is changed to change the laser output level, the photodiode 31 delivers an output proportional to the laser output.

According to the invention, the $p^+$ region is not always necessary; instead, the n-type silicon crystal body 3 may be coated partially with a metal film 4, on which the semiconductor laser pellet 5 may be installed.

As described above, the embodiment of FIG. 7 is advantageous in that the laser output can be detected by the photodiode which is formed in the heat sink and thus the laser output can readily be monitored without the need for an intricate arrangement.

FIG. 8 schematically illustrates an embodiment of the invention which is useful for applications where the laser output is led into an optical fiber. A groove is selectively formed on part of the silicon crystal body 3, and a photodiode 31 is formed on part of the groove. A semiconductor laser crystal pellet 5 is bonded to an end of the groove, and an optical fiber 39 is installed in the groove. In this construction, the light beam emitted from the end of the laser crystal pellet 5 enters the optical fiber 39 with small loss. Part of the laser output leaks out of the wall of the optical fiber. This leaking beam is detected by the photodiode 31 whereby the laser output led into the optical fiber can be monitored.

According to this embodiment, the loss in coupling the laser output beam to the optical fiber can be minimized and the laser output beam led into the optical fiber can easily be monitored.

FIG. 9 schematically illustrates a further embodiment of the invention which comprises a circuit having a self-control function. This semiconductor laser device consists essentially of a semiconductor laser pellet mounted on a silicon heat sink, a photodiode for detecting laser output, and a simple feedback circuit.

A photodiode 31, transistors 34 and 35, and three $p^+$ isolation regions 33 and one $p^+$ isolation region 32 are fomred on a p-type silicon crystal body 3 by semiconductor processing techniques. A semiconductor laser crystal pellet 5 is formed on a part of the $p^+$ region 32 as in the embodiment of FIG. 7. The n-type region of the semiconductor laser crystal pellet 5 is connected to the collector (c) of the transistor 34 through an electrode lead. The emitters (e) of the transistors 34 and 35 are connected to each other through an electrode lead, to which a resistor $R_5$ is connected. The base (b) of the transistor 34 is connected to resistors $R_6$ and $R_7$ through an electrode lead. The n-type region of the photodiode 31 is connected to a resistor $R_3$ through an electrode lead. The p-type region of the photodiode 31 is connected to the base (b) of the transistor 35 through an electrode lead, to which a resistor $R_4$ is connected. The $p^+$ region 32, the collector (c) of transistor 35, the resistor $R_3$, and the resistor $R_6$ are connected to each other through a lead wire and thence to the positive side of a DC power supply. The resistors $R_4$, $R_5$ are connected to each other and thence to the negative side of the DC power supply. The resistors $R_3$ to $R_7$ may be formed on the silicon crystal body 3 by the known IC fabrication techniques.

In this construction, the semiconductor laser 5 is biased forward, and the photodiode 31 is reverse biased. By suitably determining the resistance value of resistor $R_3$, an optimum reverse bias can be applied to the photodiode 31. The current flowing in the semiconductor laser 5 is the current flowing in the collector of the transistor 34. Part of the laser output beam from the mirror surface of the semiconductor laser falls on the p-n junction of the photodiode 31 to cause a light current to flow in the photodiode 31.

FIG. 10 shows an equivalent circuit of the embodiment of FIG. 9, assuming that the base potential of transistor 34 is $V_1$, and that of transistor 35 is $V_2$. When $V_1 = V_2$, the current flowing in the semiconductor laser was observed to be constant, the laser output was also constant, and the current flowing in the photodiode 31 was accordingly also constant. When the ambient temperature is raised, the output of the semiconductor laser is lowered if the control circuit is omitted. In this embodiment, the current from the photodiode 31 is reduced and the current flowing in the resistor $R_4$ is reduced accordingly. As a result, $V_1$ becomes higher than $V_2$, causing the collector current of transistor 34 to tend to increase. This serves to increase the current flowing in the semiconductor laser to cause the laser output to tend to increase. As a result of this operation, the laser output is kept constant. If the laser output becomes large, the control circuit operates in a reverse way to lower the increasing laser output. When the sensitivity of the photodiode is high enough to detect changes in the laser output, and the current amplification factors of transistors 34 and 35 are large enough, feedback is effected to keep the laser output constant. The desired value of laser output can easily be obtained by suitably determining the value of the resistor $R_7$.

As described above, the laser output can be stabilized by the use of the photodiode formed in part of the heat sink, together with the feedback circuit.

According to the invention, as has been described in detail, a semiconductor laser crystal pellet and a silicon crystal heat sink are combined into a simple construction capable of highly efficient heat dissipation, as well as additional useful functions such as laser output monitoring and control. Although the invention has been described with respect to several embodiments, it will be apparent that modification thereto may be made by those skilled in the art without necessarily departing from the spirit and scope of the invention.

What is claimed is:

1. A semiconductor laser device comprising a semiconductor laser crystal body having a side face and which generates a laser beam and heat during operation, an electrically conductive silicon crystal body having a side face and two opposite main surfaces of a larger area than that of said semiconductor laser crystal body, first means for electrically and thermally connecting said semiconductor crystal body to one of said main surfaces of said silicon crystal body, thereby providing ohmic contact between said silicon crystal body and said semiconductor crystal body, a metal body having a main surface of a larger area than that of said silicon crystal body, and second means spaced from said first connecting means for electrically and thermally connecting the other of said main surfaces of said silicon crystal body to said main surface of said metal body, thereby providing ohmic contact between said silicon crystal body and said metal body, whereby an electrical conduction path is established from said metal body to said semiconductor crystal body through said silicon crystal body.

2. The semiconductor laser device of claim 1, in which said one main surface of said silicon crystal body is substantially flat, and said semiconductor laser crystal body is so positioned on the flat main surface of said silicon crystal body that a laser beam from said side face of said semiconductor laser crystal body is emitted without intersection with said first means and said silicon crystal body.

3. The semiconductor laser device of claim 2, in which said first means consists of a metallic layer, and said side face of said semiconductor laser crystal body is substantially flush with a side face of said metallic layer and with said side face of said silicon crystal body.

4. The semiconductor laser device of claim 1, wherein a plurality of semiconductor lasers are formed in an array in said semiconductor laser crystal body, a plurality of mutually independent electrically conductive regions being formed in said silicon crystal body corresponding to the electrodes of one of said plurality of semiconductor lasers, said electrodes and said electrically conductive regions being electrically connected to each other, said plurality of semiconductor lasers being able to be driven independently of each other.

5. The semiconductor laser device of claim 1, further comprising a diode formed by diffusing an impurity in said silicon crystal body, and means for connecting said diode to said semiconductor laser crystal body so that a bypass is formed for said semiconductor laser crystal body in the event a reverse voltage is applied thereto.

6. The semiconductor laser device of claim 1, further comprising a photodiode formed in said silicon crystal body in an area where an output beam from said semiconductor laser crystal body falls and means for controlling said current-supplying means in response to the output current of said photodiode.

7. The semiconductor laser device of claim 1, in which said side face of said silicon crystal body is substantially flat and perpendicular to said flat main surface of said silicon crystal body, and said laser crystal body is positioned at the edge of said main surface of said silicon crystal body so that said side face of said semiconductor laser crystal is substantially flush with said flat side face of said silicon crystal body.

8. A semiconductor laser device comprising a semiconductor laser crystal body having a side face and which generates a laser beam and heat during operation, an electrically conductive silicon crystal body having a side face and two opposite main flat surfaces of a larger area than that of said semiconductor laser crystal body in the direction of said laser beam and in which said side face of said silicon crystal body is substantially perpendicular to said main flat surfaces, first means for electrically and thermally connecting said laser crystal body to one of said main flat surfaces of said silicon crystal body with said side face of said laser crystal body substantially flush with said side face of said silicon body, thereby providing ohmic contact between said laser crystal body and said silicon crystal body, a metal body having a main surface of a larger area than that of said silicon crystal body, second means separated from said first connecting means for electrically and thermally connecting the other of said main flat surfaces of said silicon crystal body to said main surface of said metal body and thereby providing ohmic contact between said silicon crystal body and said metal body, a lead wire bonded to another part of said crystal body, and means for supplying electrical current between said metal body and said lead wire.

* * * * *

UNITED STATES PATENT OFFICE
CERTIFICATE OF CORRECTION

Patent No. 4,092,614            Dated May 30, 1978

Inventor(s) I. Sakuma et al

It is certified that error appears in the above-identified patent and that said Letters Patent are hereby corrected as shown below:

Claim 8, line 29, column 10, before "crystal"

insert -- laser --.

Signed and Sealed this

Fourteenth Day of November 1978

[SEAL]

Attest:

RUTH C. MASON
Attesting Officer

DONALD W. BANNER
Commissioner of Patents and Trademarks